United States Patent
Yoo et al.

(10) Patent No.: US 8,953,383 B2
(45) Date of Patent: Feb. 10, 2015

(54) OPERATING CIRCUIT CONTROLLING DEVICE, SEMICONDUCTOR MEMORY DEVICE AND METHOD OF OPERATING THE SAME

(71) Applicant: SK Hynix Inc., Icheon-si Gyeonggi-do (KR)

(72) Inventors: Byoung Sung Yoo, Seoul (KR); Jin Su Park, Icheon-si (KR); Sang Don Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 39 days.

(21) Appl. No.: 13/845,218

(22) Filed: Mar. 18, 2013

(65) Prior Publication Data

US 2014/0177332 A1 Jun. 26, 2014

(30) Foreign Application Priority Data

Dec. 20, 2012 (KR) .......................... 10-2012-0149098

(51) Int. Cl.
  *G11C 16/06* (2006.01)
  *G11C 16/10* (2006.01)
  *G11C 16/04* (2006.01)
  *G11C 16/22* (2006.01)
  *G11C 16/32* (2006.01)

(52) U.S. Cl.
  CPC ............ *G11C 16/10* (2013.01); *G11C 16/0483* (2013.01); *G11C 16/22* (2013.01); *G11C 16/32* (2013.01)

USPC .............. 365/185.2; 365/185.23; 365/189.09

(58) Field of Classification Search
  CPC .......... G11C 16/08; G11C 16/30; G11C 8/08; G11C 5/147
  USPC ........ 365/185.23, 189.07, 189.09, 226, 185.2
  See application file for complete search history.

(56) References Cited

U.S. PATENT DOCUMENTS

| | | | | |
|---|---|---|---|---|
| 8,379,454 B2 * | 2/2013 | Kochar et al. | ............ | 365/185.19 |
| 8,514,630 B2 * | 8/2013 | Huynh et al. | ............ | 365/185.21 |
| 8,730,722 B2 * | 5/2014 | Koh et al. | ................ | 365/185.03 |
| 2013/0265838 A1 * | 10/2013 | Li | ................................. | 365/194 |
| 2013/0265841 A1 * | 10/2013 | Duzly et al. | .................. | 365/228 |

FOREIGN PATENT DOCUMENTS

| KR | 1020120033523 A | 4/2012 |
|---|---|---|
| KR | 1020120061558 A | 6/2012 |

* cited by examiner

*Primary Examiner* — Gene Auduong
(74) *Attorney, Agent, or Firm* — William Park & Associates Patent Ltd.

(57) ABSTRACT

A semiconductor memory device is kept in a busy state by controlling a ready/busy pad when a detection signal is output since an external voltage is less than a reference voltage, prevents generation of an operating voltage by a pump circuit by preventing generation of a pump clock, and resets a microcontroller by preventing generation of micro clock. Accordingly, the semiconductor memory device may be prevented from malfunctioning through a series of operations when the external voltage is less than the reference voltage.

10 Claims, 10 Drawing Sheets

OPERATING CIRCUIT CONTROLLING DEVICE, SEMICONDUCTOR MEMORY DEVICE AND METHOD OF OPERATING THE SAME

CROSS-REFERENCE TO RELATED APPLICATION

The present application claims priority to Korean patent application number 10-2012-0149098 filed on Dec. 20, 2012, in the Korean Intellectual Property Office, the entire disclosure of which is incorporated by reference herein.

BACKGROUND

1. Technical Field

Various embodiments relate generally to an operating circuit controlling device, a semiconductor memory device and a method of operating the semiconductor memory device.

2. Related Art

Semiconductor memory devices are typically categorized into volatile or non-volatile memory devices.

Volatile memory devices are considered to operate in high write and read speeds, but they are unable to retain the stored data when the power is off. Non-volatile memory devices operate at relatively lower write and read speeds, but they can retain the stored data regardless of power on/off conditions. Examples of the non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories are categorized into NOR or NAND type.

Flash memories enjoy the advantages of both RAM and ROM. For example, flash memories can be freely programmed and erased similar to RAM. Similar to ROM, flash memories can retain the stored data even when they are not powered. Flash memories have been widely used as the storage media of portable electronic devices such as mobile phones, digital cameras, personal digital assistants (PDAs), and MP3 players.

Sudden drop of the voltage applied to a semiconductor memory device may occur at unpredictable times for various reasons, and this can cause problems in the semiconductor memory device.

BRIEF SUMMARY

Various embodiments relate to a semiconductor memory device preventing a malfunction by sequentially performing operation terminating processes when a voltage applied to the semiconductor memory device suddenly drops, and a method of operating the same.

An operating circuit controlling device according to an embodiment of the present invention includes a detection circuit configured to compare an external voltage with a reference voltage and activate a detection signal when the external voltage is less than the reference voltage, a control logic configured to keep an operating circuit in a busy state in response to the detection signal, a control signal generation circuit configured to generate first and second control signals in response to the detection signal, a pump clock generation circuit configured to generate a pump clock to be input to a pump circuit to generate an operating voltage of the operating circuit, wherein the pump clock generation circuit is configured to be disabled in response to the first control signal, a micro clock generation circuit configured to generate a micro clock, wherein the mircoclock generation circuit is configured to be disabled in response to the first control signal, and a microcontroller configured to control the operating circuit in response to the micro clock, wherein the microcontroller is configured to be reset in response to the second control signal when the micro clock generation circuit is disabled.

A semiconductor memory device according to an embodiment of the present invention includes a memory array including memory cells coupled to word lines, an operating circuit configured to perform an operation on the memory cells, and a control circuit configured to compare an external voltage with a reference voltage and control the operating circuit to terminate the operation when the external voltage is less than the reference voltage.

A method of operating a semiconductor memory device according to an embodiment of the present invention includes activating a detection signal when an external voltage is less than a first threshold value, keeping a current state in a busy state in response to the detection signal, disabling generation of a pump clock to be input to a pump circuit to generate an operating voltage of an operating circuit and generation of a micro clock to be input to a microcontroller to control the operating circuit in response to the detection signal, resetting the microcontroller in response to the detection signal when the generation of the micro clock is disabled, and discharging all word lines in response to the detection signal.

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
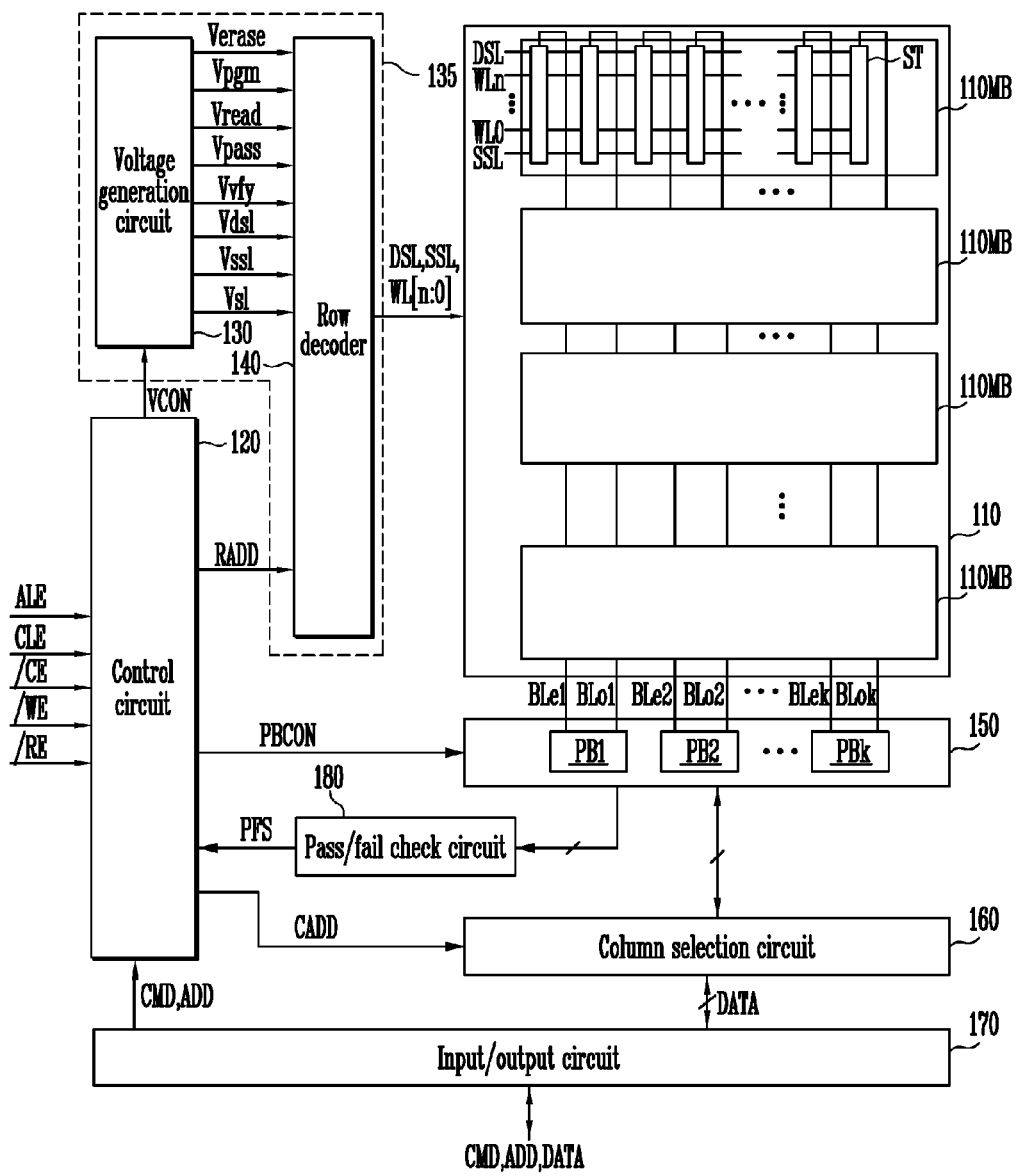
FIG. 1 is a block diagram of a semiconductor memory device according to an embodiment of the present invention.
Figure 2:
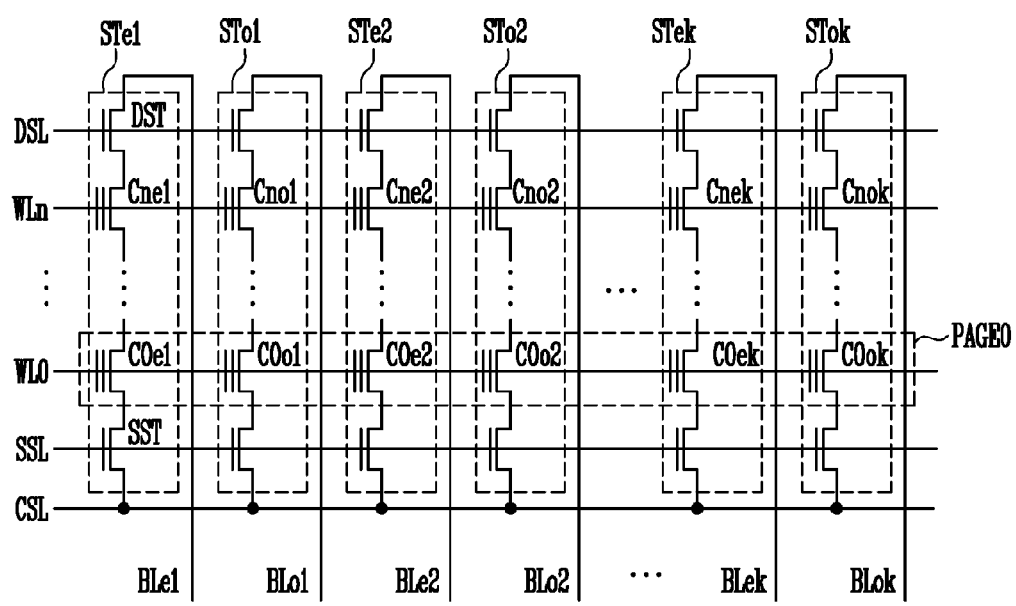
FIG. 2 is a circuit diagram of a memory block of FIG. 1.

FIG. 1 is a circuit diagram of a semiconductor memory device according to an embodiment of the present invention. FIG. 2 is a circuit diagram of a memory block of FIG. 1.

A semiconductor memory device according to an embodiment of the present invention may include a memory array 110, operating circuits 130, 140, 150, 160, 170, and 180, and a control circuit 120. The memory array 110 may include a plurality of memory blocks 110 MB. The operating circuits 130, 140, 150, 160, 170, and 180 may be configured to perform a program operation, a read operation, and an erase operation on the memory cells included in a selected page of the memory block 110 MB. The control circuit 120 may be configured to control the operating circuits 130, 140, 150, 160, 170, and 180. When the semiconductor memory device is a NAND flash memory device, the operating circuits may include a voltage supply circuit 135, a page buffer group 150, a column selection circuit 160, an input/output circuit 170 and a pass/fail check circuit 180.

With reference to FIG. 2, each of the memory blocks 110B may include a plurality of strings STe1, STe2, STe3 to STek and STo1, STo2, STo3 to Stok that are coupled between bit lines BLe1, BLe2, BLe3 to BLek and BLo1, BLo2, BLo3 to Blok and a common source line CSL. In other words, the strings STe1 to STok may be coupled to the bit lines BLe1 to Blok, respectively, and may be coupled in common to the common source line CSL. Each of the strings, for example, the string STe1 may include a source select transistor SST, a plurality of memory cells C0e1, C1e1, C2e1 to Cne1, and a drain select transistor DST. A source of the source select transistor SST may be coupled to the common source line CSL. A drain of the drain select transistor DST may be coupled to the bit line BLe1. The memory cells C0e1, C1e1, C2e1 to Cne1 may be coupled in series with the source and drain selection transistors SST and DST. A gate of the source select transistor SST may be coupled to a source selection line SSL, gates of the memory cells C0e1, C1e1, C2e1 to Cne1 may be coupled to the word lines WL0, WL1, WL2 to WLn, respectively, and a gate of the drain select transistor DST may be coupled to a drain selection line DSL.

In a NAND flash memory device, memory cells included in a memory block may be divided into physical page units or logical page units. For example, memory cells C0e1 to C0ek and C0o1 to C0ok coupled to the word line WL0 may form a single physical page PAGE0. In addition, even-numbered memory cells C0e1 to C0ek may form a single even physical page, and odd-numbered memory cells C0o1 to C0ok may form a single odd physical page. This page (or even page and odd page) may be a basic unit for a program operation or a read operation. The memory cells forming the single page PAGE1 may be divided into main cells and flag cells (or spare cells). The main cells may be memory cells for storing general data therein, and the flag cells (or space cells) may be memory cells for storing status information about a memory device therein.

Referring again to FIGS. 1 and 2, the control circuit 120 may output a voltage control signal VCON in order to generate voltages necessary to perform a program operation, verify operation, a read operation, or an erase operation in response to a command signal CMD externally received through the input/output circuit 170, and the control circuit 120 may output PB control signals PBCON in order to control page buffers PB1 to PBk included in the page buffer group 150, depending on the type of operation. In addition, the control circuit 120 may output a row address signal RADD and a column address signal CADD in response to an address signal ADD externally received through the input/output circuit 170. A chip enable signal /CE, a write enable signal /WE, a read enable signal /RE, and other external control signals that are received may be used for timing control.

The voltage supply circuit 135 may apply operating voltages (e.g., Verase, Vpgm, Vread, Vpass, Vvfy, Vdsl, Vssl and Vcsl), necessary for a program operation, a read operation and an erase operation on the memory cells, onto local lines that include the drain selection line DSL, the word lines WL0 to WLn and the source selection line SSL of a selected memory block in response to the voltage control signal VCON of the control circuit 120. The voltage supply circuit 135 may include a voltage generation circuit 130 and a row decoder 140.

The voltage generation circuit 130 may apply the operating voltages (e.g., Verase, Vpgm, Vread, Vpass, Vvfy, Vdsl, Vssl and Vcsl), necessary to perform a program operation, a read operation, or an erase operation on the memory cells, onto global lines in response to the voltage control signal VCON of the control circuit 120. For example, in order to perform a program operation, the voltage generation circuit 130 may output the program voltage Vpgm and the pass voltage Vpass to the global lines so that the program voltage Vpgm and the pass voltage Vpass may be applied to memory cells of the selected page and unselected memory cells, respectively. In order to perform a read operation, the voltage generation circuit 130 may output the read voltage Vread and the pass voltage Vpass to the global lines so that the read voltage Vread and the pass voltage Vpass may be applied to the memory cells of the selected page and the unselected memory cells, respectively. In order to perform an erase operation, the voltage generation circuit 130 may output the erase voltage Verase onto the global lines so that the erase voltage Verase may be applied to the memory cells of the selected memory block.

The row decoder 140 may couple the global lines to the local lines DSL, WL0 to WLn and SSL in response to the row address signals RADD of the control circuit 120 so that the operating voltages output to the global lines from the voltage generation circuit 130 may be transferred from the memory array 110 to the local lines DSL, WL0 to WLn and SSL of the selected memory block 110 MB. As a result, the program voltage Vpgm or the read voltage Vread may be applied to a local word line (e.g., WL0) coupled to a selected cell (e.g., COW from the voltage generation circuit 130 through the global word line. In addition, the pass voltage Vpass may be applied to local word lines (e.g., WL1 to WLn) coupled to the unselected memory cells C1e1 to Cne1 from the voltage generation circuit 130 through the global word lines. During the erase operation, the erase voltage Verase may be applied to all of the memory cells in the block. As a result, data may be stored in the selected cell C0e1 by the program voltage Vpgm, or data stored in the selected cell C0e1 may be read by the read voltage Vread.

The page buffer group 150 may include the page buffers PB1 to PBk that are coupled to the memory array 110 through the bit lines BLe1 to BLek and BLo1 to Blok, respectively. In response to the PB control signals PBCON from the control circuit 120, the page buffers PB1 to PBk of the page buffer group 150 may selectively precharge the bit lines BLe1 to BLek or BLo1 to Blok according to data input for storing in the memory cells C0e1 to C0ek or C0o1 to C0ok, or may sense voltages of the bit lines BLe1 to BLek or BLo1 to Blok so as to read data from the memory cells C0e1 to COek or C0o1 to C0ok, respectively.

For example, when program data (e.g., data of '0') are input to the page buffer PB1 for storing in the memory cell C0e1, the page buffer PB1 may apply a program enable voltage (e.g., ground voltage) to the bit line BLe1 of the memory cell C0e1 storing the program data during the program operation. As a result, a threshold voltage of the memory cell C0e1 may increase by the program voltage Vpgm applied to the word line WL0 and the program enable voltage applied to the bit line BLe1 during the program operation. In addition, when erase data (e.g., data of '1') are input to the page buffer PB1 so as to store the erase data in the memory cell C0e1, the page buffer PB1 may apply a program inhibit voltage (e.g., power voltage) to the bit line BLe1 of the memory cell C0e1 during the program operation. As a result, even when the program voltage Vpgm is applied to the word line WL0 during the program operation, a threshold voltage of the memory cell C0e1 may not increase by the program inhibit voltage applied to the bit line BLe1. Since the threshold voltages of the memory cells vary as described above, different data may be stored in the memory cells.

During the read operation, the page buffer group 150 may precharge all selected bit lines (e.g., BLe1 to BLek) selected between the even bit lines BLe1 to BLek and the odd bit lines BLo1 to Blok, and discharge all unselected bit lines (e.g., BLo1 to BLok). In addition, when the read voltage Vread is applied to the selected word line WL0 from the voltage supply circuit 135, the bit lines of the memory cells that store the program data may remain precharged, and the bit lines of the memory cells that store erase data may be discharged. The page buffer group 150 may sense changes in the voltages of the bit lines BLe1 to BLek and latch data of the memory cells corresponding to the sensed result.

The column selection circuit 160 may select the page buffers PB1 to PBk included in the page buffer group 150 in response to the column address signal CADD output from the control circuit 120. In other words, the column selection circuit 160 may sequentially transfer the data to be stored in the memory cells to the page buffers PB1 to PBk in response to the column address signal CADD. In addition, during the read operation, the column selection circuit 160 may sequentially select the page buffers PB1 to PBk in response to the column address signal CADD so that the data of the memory cells latched in the page buffers PB1 to PBk may be externally output.

The input/output circuit 170 may transfer data to the column selection circuit 160, responsive to the control circuit 120, so that the data received from an external source for storing in the memory cells may be input to the page buffer group 150 during the program operation. When the column selection circuit 160 transfers the data provided from the input/output circuit 170 to the page buffers PB1 to PBk in the page buffer group 150 as described above, the page buffers PB1 to PBk may latch the data in an internal latch circuit. In addition, during the read operation, the input/output circuit 170 may externally output the data transferred from the page buffers PB1 to PBk of the page buffer group 150 through the column selection circuit 160.

The pass/fail check circuit 180 may output a pass/fail signal PFS in response to comparison result signals output from the page buffers PB1 to PBk during a program verify operation performed after the program operation. More specifically, during the program verify operation, a threshold voltage of a memory cell may be compared with a target voltage, and a result of the comparison may be latched in the internal latch circuit of the page buffers PB1 to PBk. In addition, the latched comparison result signals may be output to the pass/fail check circuit 180. The pass/fail check circuit 180 may output the pass/fail signal PFS, indicating whether or not the program operation has been completed, to the control circuit 120 in response to the comparison result signals. The control circuit 120 may determine whether a memory cell having a lower threshold voltage than the target voltage has been found among memory cells for storing the program data in response to the pass/fail signal PFS. As a result of the determination, the control circuit 120 may determine whether or not to repeat the program operation.

When a bit line or a channel is discharged since an external voltage applied to a semiconductor memory device suddenly drops, various problems may occur. For example, since the bit line is discharged, the channel may correspondingly be discharged. As a result, program inhibited cells may not be program-inhibited. In other words, when an unselected bit line is discharged, and a selected bit line is discharged by coupling, a channel of memory cells to be programmed may be open since a bit line voltage is reduced to a negative voltage level. After the selected bit line is discharged, a channel of neighboring memory cells may be discharged through a junction diode.

Therefore, a malfunction caused when the external voltage applied to the semiconductor memory device suddenly drops needs to be prevented.

Figure 3:
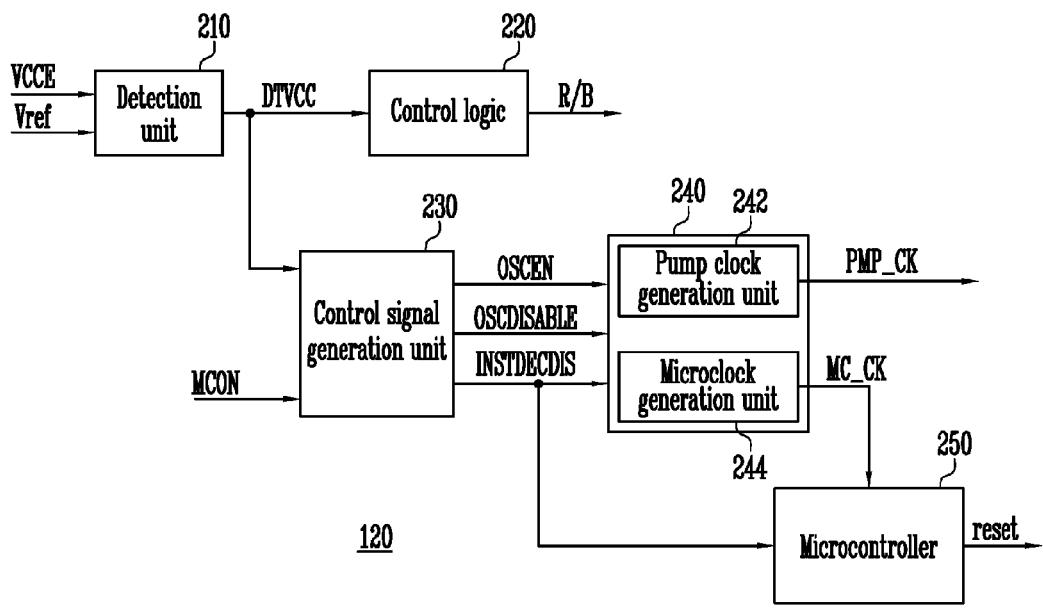
FIG. 3 is a block diagram of a control circuit of FIG. 1.

FIG. 3 is a block diagram of the control circuit of FIG. 1.

With reference to FIG. 3, the control unit 120, as illustrated in FIG. 1, may include a detection unit 210 (i.e., detection circuit), a control logic 220, a control signal generation unit 230 (i.e., control signal generation circuit), a clock generation unit 240 and a microcontroller 250.

The detection unit 210 may compare an external voltage VCCE with a reference voltage Vref to generate and output a detection signal DTVCC. The reference voltage Verf may be a bandgap voltage that is generated by a bandgap voltage generator. The detection signal DTVCC may be a pulse signal. The detection unit 210 may generate and output the detection signal DTVCC having a first level (e.g., high, and hereinafter, referred to as "H") when the external voltage VCCE is less than the reference voltage Vref. The detection unit 210 may generate and output the detection signal DTVCC having a second level (e.g., low, and hereinafter referred to as "L") when the external voltage VCCE is greater than the reference voltage Vref.

The control logic 220 may output a ready/busy signal R/B, indicating the current state of the semiconductor memory device, to a ready/busy pad RBPAD (not shown) in response to the detection signal DTVCC. When the external voltage VCCE is less than the reference voltage Vref, the control logic 220 may keep an operating state of the semiconductor memory device in a busy state in response to the detection signal DTVCC.

The control signal generation unit 230 may output a first control signal OSCDISABLE and a second control signal INSDECDIS in response to the detection signal DTVCC. More specifically, when the external voltage VCCE is less than the reference voltage Vref, the control signal generation unit 230 may output the first control signal OSCDISABLE and the second control signal INSDECDIS in response to the detection signal DTVCC having the first level, and when the external voltage VCCE is greater than the reference voltage Vref, the control signal generation unit 230 may output the second control signal INSDECDIS and a third control signal OSCEN in response to the detection signal DTVCC having the second level. The first control signal OSCDISABLE may be a clock disable signal, the second control signal INSDEC-DIS may be a signal for discharging an instruction decoder of the microcontroller 250 to be described below, and the third control signal OSCEN may be a clock enable signal.

The clock generation unit 240 may include a pump clock generation unit 242 (i.e., pump clock generation circuit) and a micro clock generation unit 244 (i.e., micro clock generation circuit).

The pump clock generation unit 242 may generate a pump clock PMP_CK that is used by a pump circuit configured to generate an operating voltage in response to the third control signal OSCEN which is a clock enable signal. The pump clock generation unit 242 may be disabled in response to the first control signal OSCDISABLE which is a clock disable signal and may not generate the pump clock PMP_CK.

The micro clock generation unit 244 may generate a micro clock MC_CK that is used by the microcontroller in response to the third control signal OSCEN. The micro clock generation unit 244 may be disabled in response to the first control signal OSCDISABLE and may not generate the micro clock MC_CK.

The microcontroller 250 may control operations of the semiconductor memory device. The microcontroller 250 may perform a source-synchronous operation in response to the micro clock MC_CK. The microcontroller 250 may not perform the source-synchronous operation when the micro clock MC_CK is not input. Therefore, the microcontroller 250 may be reset, which is referred to as micro reset.

When the external voltage VCCE is less than the reference voltage Vref, and the detection signal DTVCC is output, the control circuit may control the ready/busy pad RBPAD to keep the semiconductor memory device in the busy state, prevent the generation of the pump clock PMP_CK to keep the pump circuit from generating operating voltages, and prevent the generation of the micro clock MC_CK to reset the microcontroller 250. Therefore, when the external voltage VCCE is less than the reference voltage Vref, a malfunction may be prevented through a series of operations.

Figure 4:
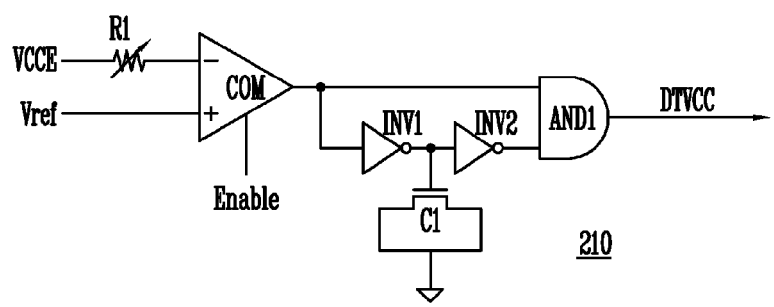
FIG. 4 is a circuit diagram of a detection unit of FIG. 3.

FIG. 4 is a circuit diagram of the detection unit of FIG. 3.

Referring to FIG. 4, the detection unit 210 may include a first variable resistor R1, a comparator COM, first and second inverters INV1 and INV2, a capacitor C1 and a first logic device AND1.

The comparator COM may compare the external voltage VCCE with the reference voltage Vref. When an output signal from the comparator COM and a signal obtained by passing the output signal through the first and second inverters INV1 and INV2 are input to the first logic device AND1, the detection signal DTVCC may be output.

The comparator COM may output a signal having a first level when the external voltage VCCE is less than the reference voltage Vref. When the signal having the first level is input to both input terminals of the first logic device AND1, the detection signal DTVCC having the first level may be output.

Figure 5:
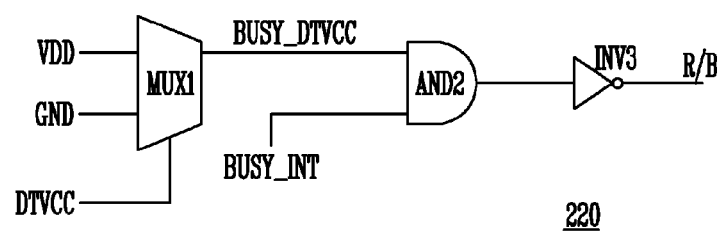
FIG. 5 is a circuit diagram of a control logic of FIG. 3.

FIG. 5 is a circuit diagram of the control logic of FIG. 3.

Referring to FIG. 5, the control logic 220 may include a first multiplexer MUX1, a second logic device AND2 and a third inverter INV3.

The first multiplexer MUX1 may output any one of an internal voltage VDD and a ground voltage GND as an output signal in response to the detection signal DTVCC. When the external voltage VCCE is less than the reference voltage Vref, the first multiplexer MUX1 may output an output signal BUSY_DTVCC having a first level in response to the detection signal DTVCC having the first level.

When the output signal BUSY_DTVCC having the first level and an initialization signal BUSY_INT having the first level are input to an input terminal of the second logic device AND2, a signal having the first level may be output. The signal having the first level may pass through the third inverter to thereby output the ready/busy signal R/B having a second level. The ready/busy signal R/B having the second level may refer to the busy state.

Figure 6:
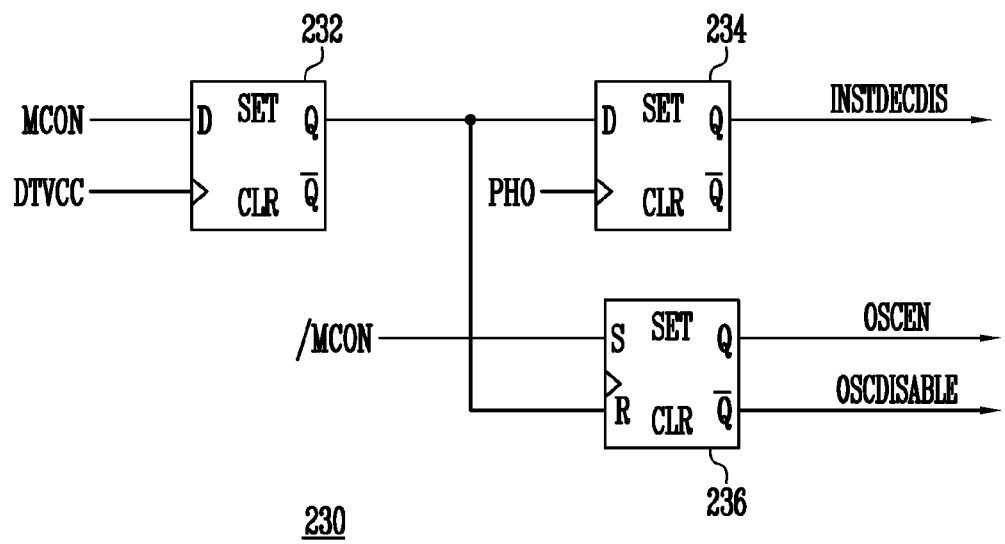
FIG. 6 is a circuit diagram of a control signal generation unit of FIG. 3.

FIG. 6 is a circuit diagram of the control signal generation unit of FIG. 3.

Referring to FIG. 6, the control signal generation unit 230 may include a first D flip-flop 232, a second D flip-flop 234 and a first SR flip-flop 236.

The first D flip-flop 232 may output an input signal MCON in response to the detection signal DTVCC having the first level H.

The second D flip-flop 234 may output a second control signal INSTDECDIS in response to a first phase clock signal PH0 having the first level H.

The first SR flip-flop 236 may output the first control signal OSCDISABLE and the third control signal OSCEN in response to an output signal from the first D flip-flop 232 and an input signal /MCON obtained by inverting the output signal.

Therefore, the control signal generation unit 230 may output the first control signal OSCDISABLE having the first level, the second control signal INSTDECDIS having the first level and the third control signal OSCEN having the second level in response to the detection signal DTVCC having the first level H.

Figure 7:
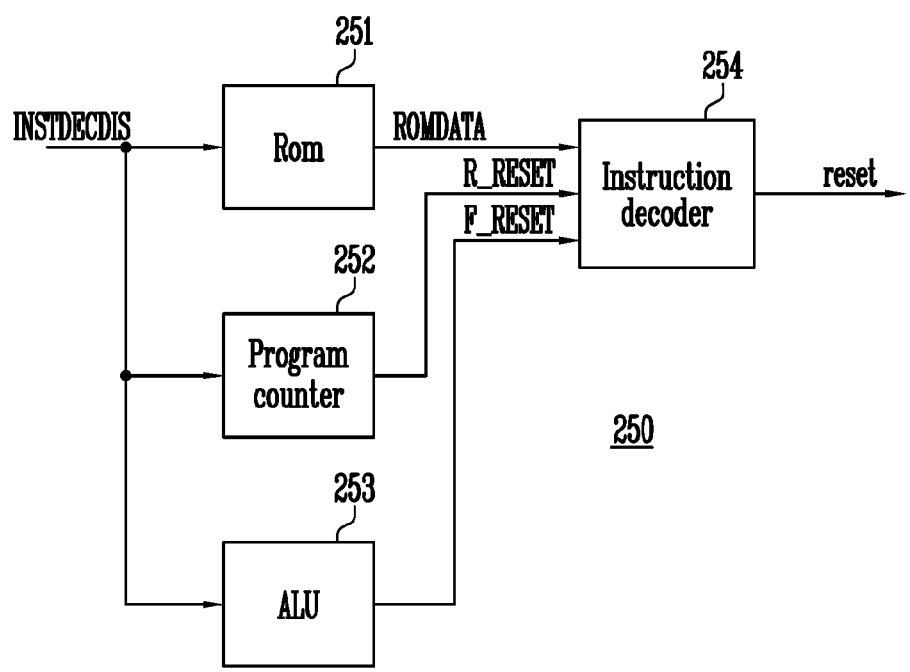
FIGS. 7 and 8 are block diagrams of a microcontroller of FIG. 3.
Figure 8:
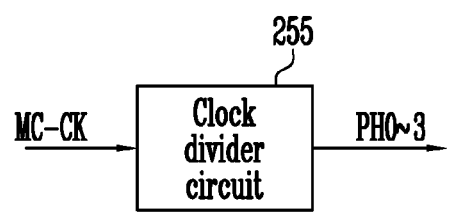

FIGS. 7 and 8 are block diagrams illustrating the microcontroller of FIG. 3.

Referring to FIG. 7, the microcontroller 250 may include a read-only memory ROM 251, a program counter 252, an arithmetic-logic unit (ALU) 253, and an instruction decoder 254.

Internal data of the ROM 251 may be reset in response to the second control signal INSTDECDIS. In other words, all the internal data may become "0".

A register of the program counter 252 may be reset in response to the second control signal INSTDECDIS. Therefore, the program counter 252 may be reset.

A flag value of the ALU 253 may be reset in response to the second control signal INSTDECDIS.

A decoding sequence of the instruction decoder 254 may be reset when the internal data of the ROM 251 are reset (i.e., ROMDATA), the register of the program counter 252 is reset (i.e., R_RESET), and the flag value of the ALU 253 is reset (i.e., F_RESET). Therefore, the semiconductor memory device may be prevented from malfunctioning.

Referring to FIG. 8, the microcontroller may include a clock divider circuit 255.

The clock divider circuit 255 may output first to fourth phase clock signals PH0 to PH3 in response to the micro clock MC_CK. The first to fourth phase clock signals PH0 to PH3 may be used to control the ROM 251, the program counter 252, the ALU 253 and the instruction decoder 254.

Figure 9:
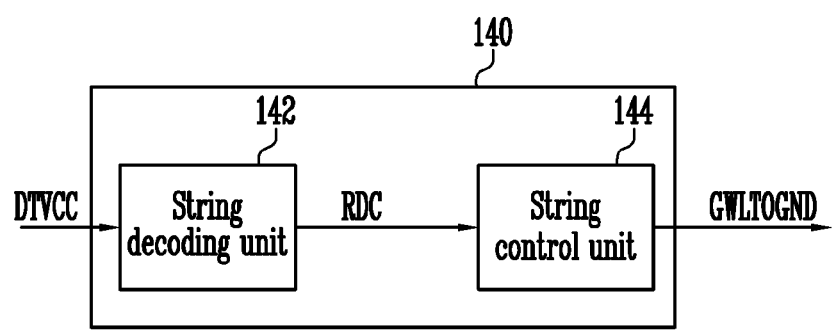
FIG. 9 is a block diagram of a row decoder of FIG. 1.

FIG. 9 is a block diagram illustrating the row decoder of FIG. 1.

Referring to FIG. 9, the row decoder 140 may include a string decoding unit 142 and a string control unit 144.

The string decoding unit 142 may output a decoding signal RDC having a first code value (e.g., '000') in response to the detection signal DTVCC.

The string control unit 144 may output a signal GWL-TOGND to discharge the global word lines in response to the decoding signal RDC having the first code value.

The row decoder 140 may quickly discharge the word lines in response to the detection signal DTVCC when the external voltage is less than the reference voltage. Therefore, the semiconductor memory device may be prevented from malfunctioning.

Figure 10:
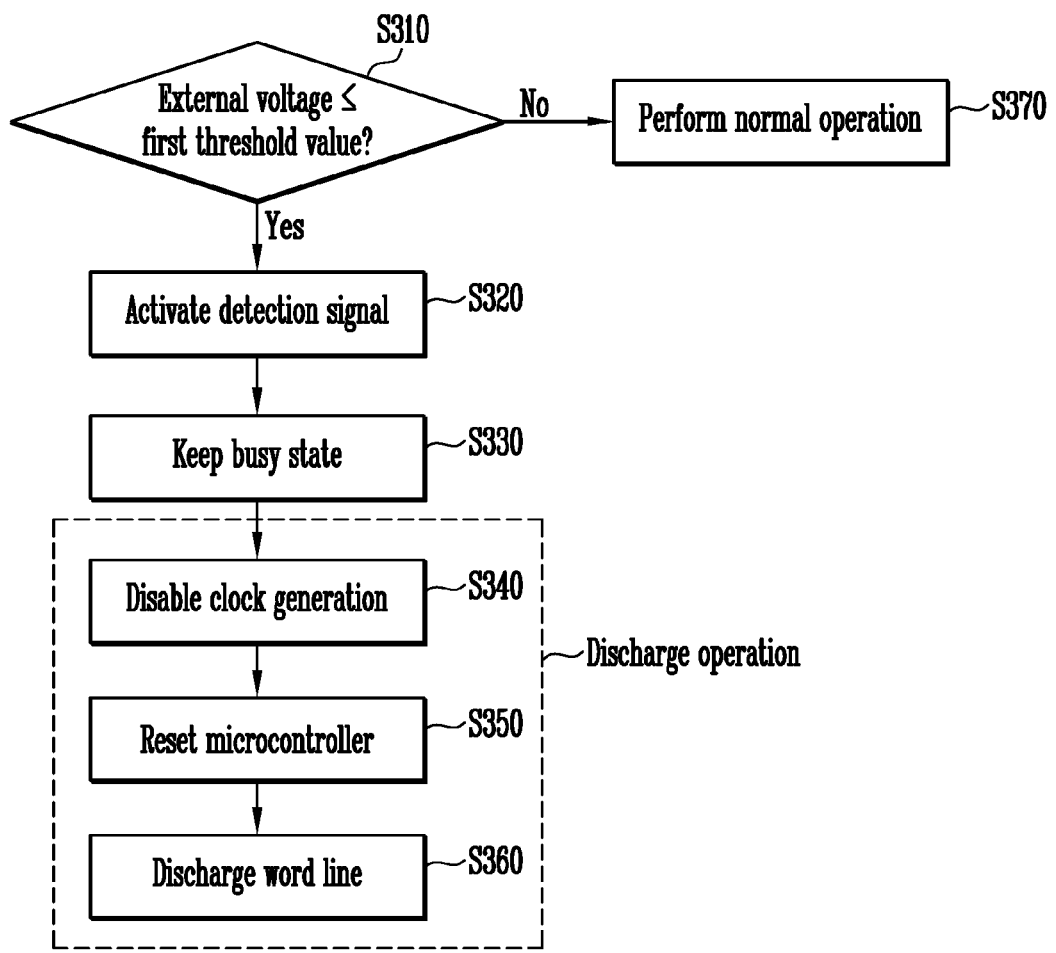
FIGS. 10 to 12 are flowcharts illustrating a method of operating a semiconductor memory device according to an embodiment of the present invention.
Figure 11:
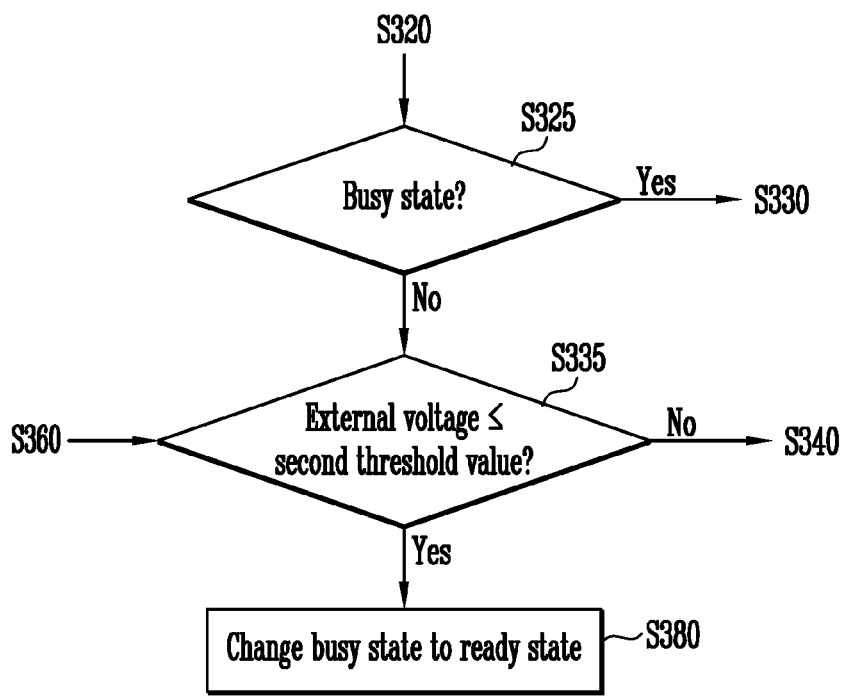
Figure 12:
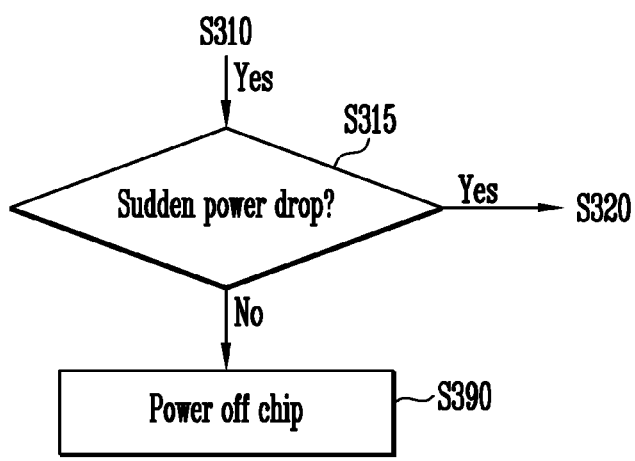
Figure 13:
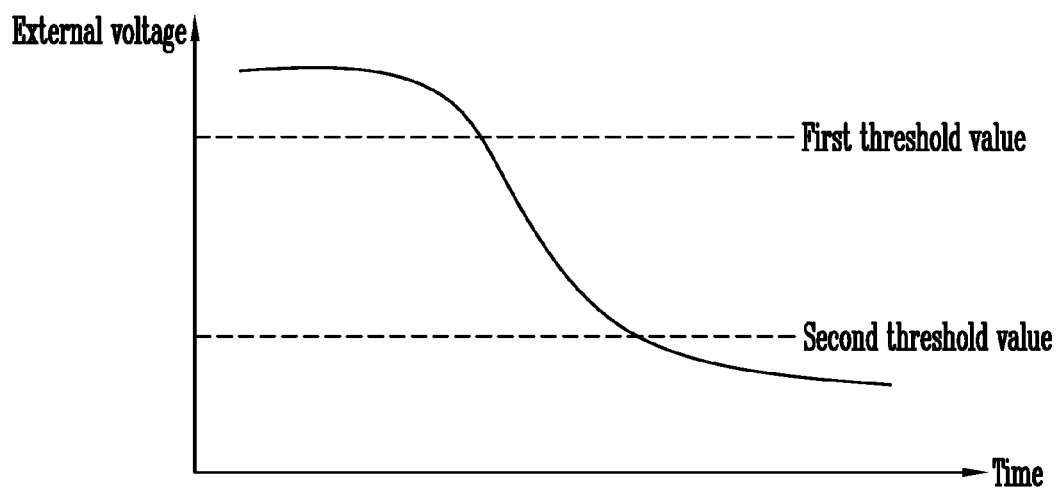
FIG. 13 is a view illustrating first and second threshold values of an external voltage of FIGS. 11 and 12.

FIGS. 10 to 12 are flowcharts illustrating a method of operating a semiconductor memory device according to an embodiment of the present invention. FIG. 13 is a view illustrating first and second threshold values of the external voltage of FIGS. 11 and 12.

Referring to FIG. 10, according to a method of operating a semiconductor memory device according to an embodiment of the present invention, an external voltage may be detected first, it may be determined whether the external voltage is less than or equal to a first threshold value at step S310. When the external voltage is less than the first threshold value, a detection signal may be activated at step S320.

The current state may be kept in a busy state in response to the activated detection signal at step S330.

Subsequently, generation of a pump clock to be input to a pump circuit so as to generate an operating voltage of an operating circuit may be disabled in response to the activated detection signal, and generation of a micro clock to be input to a microcontroller so as to control the operating circuit may be disabled at step S340.

Subsequently, when the generation of the micro clock is disabled, the microcontroller may be reset in response to the activated detection signal at step S350.

Subsequently, all word lines may be discharged in response to the activated detection signal at step S360. Steps S340 to S360A may be referred to as a discharge operation.

When it is determined that the external voltage exceeds the first threshold value at step S310, a normal operation may be performed at step S370.

Referring to FIG. 11, after the detection signal is activated at S320, it may be determined whether the current state is the busy state at step S325. When the current state is the busy state, the process flow proceeds to step S330.

When the current state is not the busy state, it may be determined whether the external voltage is less than or equal to a second threshold value at step S335. When the external voltage is less than the second threshold value, the current state may change from the busy state to a ready state at step S380, whereby errors occurring when the semiconductor memory device is kept in the busy state. When the external voltage exceeds the second threshold value, the process flow proceeds to step S340, and the discharge operation may be performed at steps S340 to S360.

In other words, when the external voltage is less than the second threshold value, the discharge operation (at steps S340 to S360) may not be performed, and the current state may be changed to the ready state. When the external voltage exceeds the second threshold value and is less than the first threshold value, the discharge operation may be performed at steps S340 to S360.

Meanwhile, after step S360 of FIG. 10, the process flow may proceed to step S335.

Referring to FIG. 12, it may be determined whether a decrease in the external voltage when it is determined the external voltage is less than the first threshold value at step S310 corresponds to a sudden power drop at step S315. When the external voltage is reduced by a predetermined value or higher for a predetermined period of time, it may be determined that the sudden power drop has occurred.

When the sudden power drop has occurred, the process flow proceeds to step S320. Therefore, the discharge operation may be performed at steps S340 to S360. When the sudden power drop has not occurred, the external voltage may smoothly decrease, and thus, the operation may be performed when power is stabilized. As a result, the discharge operation (at steps S340 to S360) may not be performed because side effects are unlikely to occur by the sudden power drop. Therefore, the power of the semiconductor memory device may be off in substantially the same manner as a conventional semiconductor memory device at step S390.

Referring to FIG. 13, the second threshold value may be less than the first threshold value.

The second threshold value may refer to a voltage at which logic devices (logic gates) start to detect the external voltage as a logic low level (or zero level). When the external voltage is less than the second threshold value, a buffer of an input/output pad may detect that a voltage level of the semiconductor memory device may allow a chip to be reset. In addition, the ready/busy pad RBPAD may be automatically changed (increased) to change the current state to a ready state.

When the detection signal is activated since the external voltage is less than the reference voltage, the semiconductor memory device may be kept in the busy state, the generation of the pump clock may be disabled to thereby disable the generation of operating voltages by the pump circuit, and the generation of the micro clock may be disabled to thereby reset the microcontroller. Therefore, when the external voltage is less than the reference voltage, a malfunction may be prevented through a series of operations. In addition, when the external voltage is less than the reference voltage, the word lines may be quickly discharged in response to the detection signal. Therefore, the semiconductor memory device may be prevented from malfunctioning.

Figure 14:
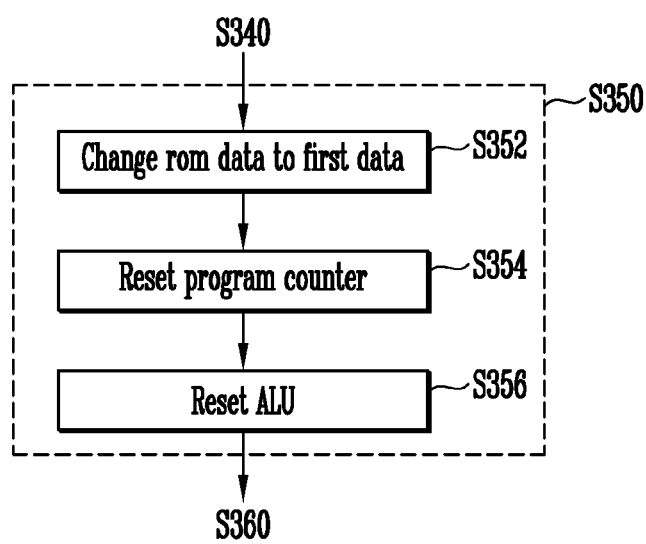
FIG. 14 is a flowchart illustrating operations of resetting a microcontroller of FIG. 10.

FIG. 14 is a flowchart illustrating operations of resetting the microcontroller of FIG. 10.

First, referring to FIG. 14, when the microcontroller is reset at step S350, ROM data may be changed to first data at step S352. All the ROM data may be reset to data '0'.

Subsequently, the program counter may be reset by resetting the register of the program counter at step S354.

Finally, the ALU may be reset by resetting the flag value of the ALU at step S356.

Figure 15:
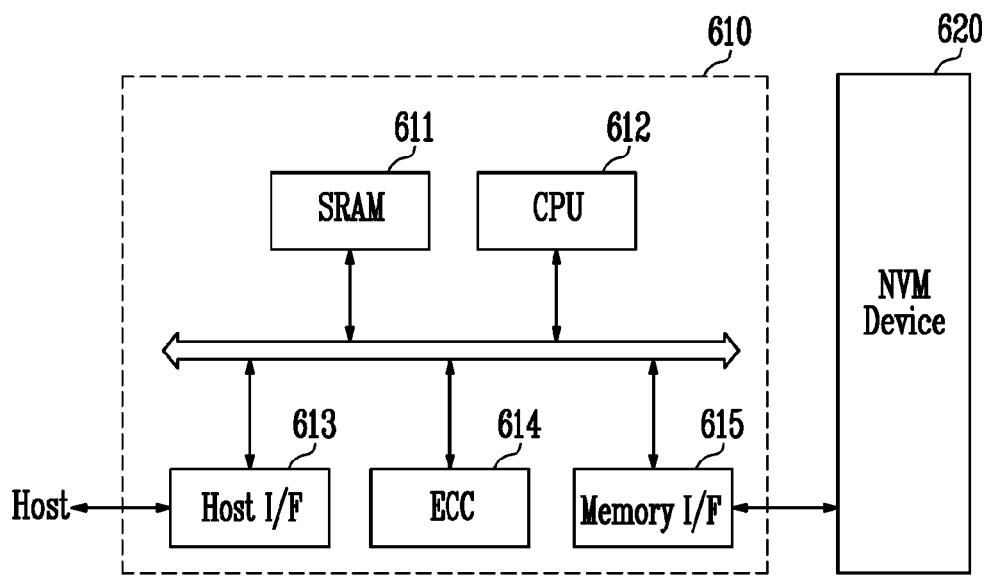
FIG. 15 is a schematic block diagram of a memory system according to an embodiment of the present invention.

FIG. 15 is a schematic block diagram of a memory system according to an embodiment of the present invention.

Referring to FIG. 15, a memory system 600 according to an embodiment of the present invention may include a non-volatile memory device 620 and a memory controller 610.

The non-volatile memory device 620 may be configured into the above-described semiconductor memory device and may be operated by the above-described method for compatibility with the memory controller 610. The memory controller 610 may be configured to control the non-volatile memory device 620. The memory system 600 having the above-described configuration may be a memory card or a solid state disk (SSD) in which the non-volatile memory device 620 and the memory controller 610 are combined. SRAM 611 may function as an operation memory of a CPU 612. A host interface 613 may include a data exchange protocol of a host being coupled to the memory system 600. An ECC 614 may detect and correct errors included in a data read from the non-volatile memory device 620. A memory interface 614 may interface with the non-volatile memory device 620. The CPU 612 may perform the general control operation for data exchange of the memory controller 610.

Though not illustrated in FIG. 15, the memory system 600 may further include ROM (not illustrated) that stores code data to interface with the host. In addition, the non-volatile memory device 620 may be a multi-chip package composed of a plurality of flash memory chips. The memory system 600 may be provided as a storage medium having high reliability and low error rate. The flash memory device according to an embodiment of the present invention may be provided in a memory system such as a semiconductor disk device (a solid state disk (SSD)) on which research has been actively conducted. For example, when the memory system 600 is an SSD, the memory controller 110 may communicate with the outside (e.g., a host) through one of the interface protocols including USB, MMC, PCI-E, SATA, PATA, SCSI, ESDI and IDE.

Figure 16:
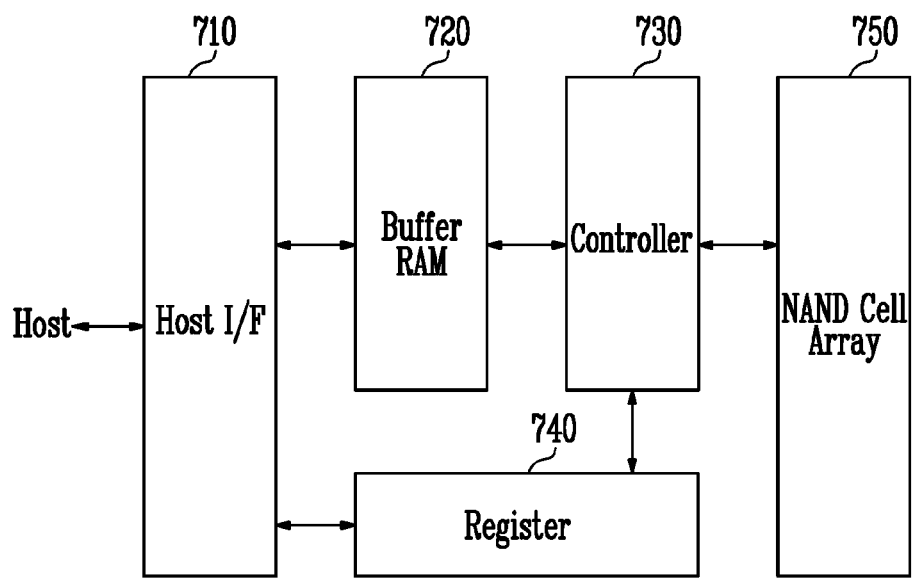
FIG. 16 is a schematic block diagram of a fusion memory device or a fusion memory system that performs a program operation according to the aforementioned various embodiments.

FIG. 16 is a schematic block diagram of a fusion memory device or a fusion memory system that performs a program operation according to the aforementioned various embodiments. For example, technical features of the present invention may be applied to a OneNand flash memory device 700 as the fusion memory device. The OneNand flash memory device 700 may include a host interface (I/F) 710, a buffer RAM 720, a controller 730, a register 740 and a NAND flash cell array 750. The host interface 710 may be configured to exchange various types of information with a device through a different protocol. The buffer RAM 720 may have built-in codes for driving the memory device or temporarily store data. The controller 730 may be configured to control read and program operations and every state in response to a control signal and a command that are externally given. The register 740 may be configured to store data including instructions, addresses and configurations defining a system operating environment in the memory device. The NAND flash cell array 750 may include operating circuits including non-volatile memory cells and page buffers. In response to a write request from a host, the OneNAND flash memory device 700 may program data in the aforementioned manner.

Figure 17:
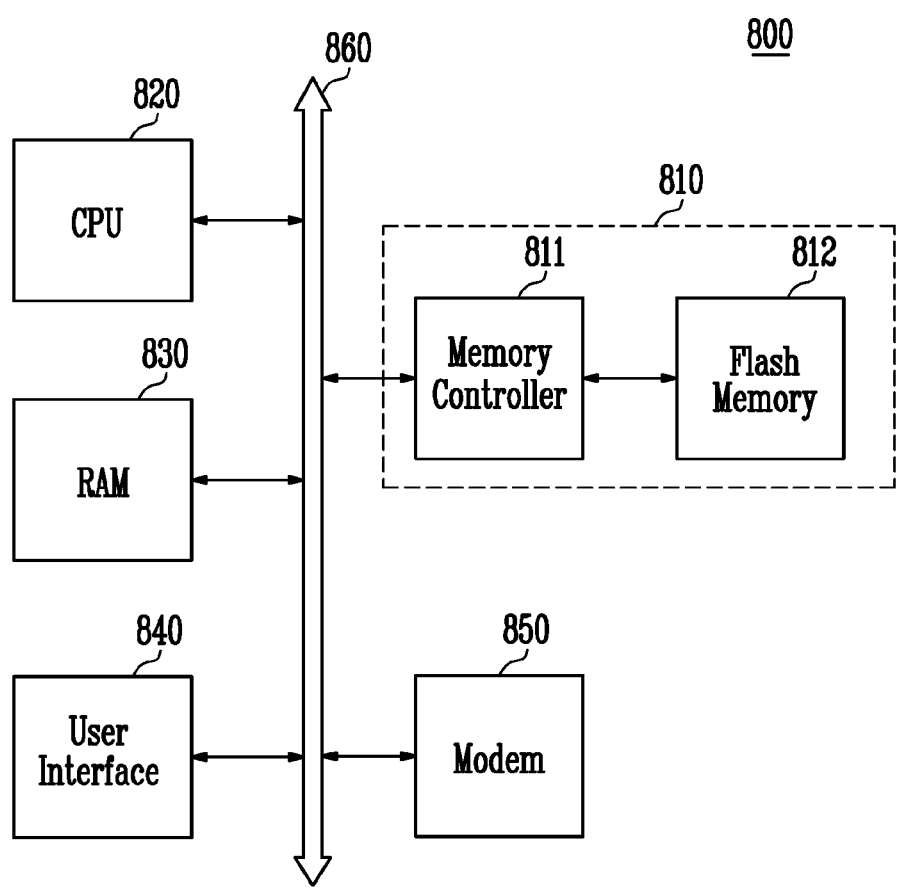
FIG. 17 is a schematic block diagram of a computing system including a flash memory device according to an embodiment of the present invention.

FIG. 17 is a schematic block diagram of a computing system including a flash memory device 812 according to an embodiment of the present invention.

A computing system 800 according to an embodiment of the present invention may include a microprocessor (CPU) 820, RAM 830, a user interface 840, a modem 850, such as a baseband chipset, and a memory system 810 that are electrically coupled to a system bus 860. In addition, if the computing system 800 is a mobile device, then a battery may be provided to apply operating voltages to the computing system 800. Though not shown in FIG. 8, the computing system 800 may further include application chipsets, a Camera Image Processor (CIS), or mobile DRAM. The memory system 810 may form a Solid State Drive/Disk (SSD) that uses a non-volatile memory to store data. The memory system 810 may be provided as a fusion flash memory (e.g., OneNAND flash memory).

According to a semiconductor memory device and a method of operating the same according to embodiments of the present invention, when a voltage applied to the semiconductor memory device suddenly drops, operation terminating processes may be sequentially performed, so that the semiconductor memory device may be prevented from malfunctioning.

While certain embodiments have been described above, it will be understood by those skilled in the art that the embodiments described are by way of example only. Accordingly, the semiconductor memory device and methods of operation described herein should not be limited based on the described embodiments. Rather, the semiconductor memory device and methods of operation described herein should only be limited in light of the claims that follow, when taken in conjunction with the above description and accompanying drawings.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An operating circuit controlling device, comprising:
   a detection circuit configured to compare an external voltage with a reference voltage and activate a detection signal when the external voltage is less than the reference voltage;
   a control logic configured to keep an operating circuit in a busy state in response to the detection signal;
   a control signal generation circuit configured to generate first and second control signals in response to the detection signal;
   a pump clock generation circuit configured to generate a pump clock to be input to a pump circuit to generate an operating voltage of the operating circuit, wherein the pump clock generation circuit is configured to be disabled in response to the first control signal;
   a micro clock generation circuit configured to generate a micro clock, wherein the mircoclock generation circuit is configured to be disabled in response to the first control signal; and
   a microcontroller configured to control the operating circuit in response to the micro clock, wherein the microcontroller is configured to be reset in response to the second control signal when the micro clock generation circuit is disabled in response to the first control signal.

2. The operating circuit control device of claim 1, wherein the first control signal is a clock disable signal and the second control signal is a signal for discharging an instruction decoder of the microcontroller.

3. The operating circuit control device of claim 1, wherein the control signal generation circuit is configured to generate a third control signal in response to the detection signal.

4. The operating circuit control device of claim 3, wherein the third control signal is a clock enable signal for generating a pump clock by the pump clock generation circuit.

5. The operating circuit control device of claim 1, wherein the microcontroller comprises: a read-only memory configured to reset internal data in response to the second control signal; a program counter configured to reset a register in response to the second control signal; an arithmetic-logic unit configured to reset a flag value in response to the second control signal; and an instruction decoder configured to be reset when the internal data of the read-only memory, the register of the program counter and the flag value of the arithmetic-logic unit are reset.

6. The operating circuit control device of claim 5, wherein the microcontroller comprises a clock divider circuit configured to output phase clock signals in response to the micro clock, the phase clock signals capable of being received by the read-only memory, the program counter, the arithmetic-logic unit, and the instruction decoder.

7. A method of operating a semiconductor memory device, the method comprising:
   activating a detection signal when an external voltage is less than a first threshold value;
   keeping a current state in a busy state in response to the detection signal;
   disabling generation of a pump clock to be input to a pump circuit to generate an operating voltage of an operating circuit and generation of a micro clock to be input to a microcontroller to control the operating circuit in response to the detection signal;
   resetting the microcontroller in response to the detection signal when the generation of the micro clock is disabled; and discharging all word lines in response to the detection signal.

8. The method of claim 7, further comprising, after the activating of the detection signal, changing the current state to a ready state when the external voltage is less than a second threshold value.

9. The method of claim 8, wherein the second threshold value is a voltage at which logic devices start to detect the external voltage as a logic low level.

10. The method of claim 7, wherein the resetting of the microcontroller comprises: changing read-only memory data into first data; resetting a program counter; and resetting an arithmetic-logic unit.

* * * * *